United States Patent
Kai et al.

(10) Patent No.: US 12,183,635 B2
(45) Date of Patent: Dec. 31, 2024

(54) WAFER PROCESSING METHOD AND WAFER PROCESSING APPARATUS

(71) Applicant: DISCO CORPORATION, Tokyo (JP)

(72) Inventors: Kenya Kai, Tokyo (JP); Kentaro Odanaka, Tokyo (JP)

(73) Assignee: DISCO CORPORATION, Tokyo (JP)

(*) Notice: Subject to any disclaimer, the term of this patent is extended or adjusted under 35 U.S.C. 154(b) by 0 days.

(21) Appl. No.: 18/052,912

(22) Filed: Nov. 5, 2022

(65) Prior Publication Data

US 2023/0066868 A1    Mar. 2, 2023

Related U.S. Application Data

(62) Division of application No. 17/024,926, filed on Sep. 18, 2020, now Pat. No. 11,515,210.

(30) Foreign Application Priority Data

Sep. 26, 2019 (JP) .................................. 2019-175694

(51) Int. Cl.
   *H01L 21/78* (2006.01)
   *H01L 21/66* (2006.01)
   *H01L 21/67* (2006.01)

(52) U.S. Cl.
   CPC ........ *H01L 21/78* (2013.01); *H01L 21/67092* (2013.01); *H01L 21/67253* (2013.01); *H01L 22/12* (2013.01)

(58) Field of Classification Search
   CPC ......... H01L 21/67092; H01L 21/67253; H01L 22/12
   See application file for complete search history.

(56) References Cited

U.S. PATENT DOCUMENTS

| | | | | |
|---|---|---|---|---|
| 2006/0009010 A1* | 1/2006 | Nagai | .................. | B28D 5/0052 438/464 |
| 2018/0108558 A1* | 4/2018 | Yin | .......................... | H01L 21/67 |
| 2018/0114696 A1* | 4/2018 | Norimoto | ........... | H01L 21/3065 |

FOREIGN PATENT DOCUMENTS

| | | |
|---|---|---|
| JP | 06232255 A | 8/1994 |
| JP | 07237066 A | 9/1995 |
| JP | 10284449 A | 10/1998 |

(Continued)

OTHER PUBLICATIONS

DE Office Action with machine translation for corresponding DE Patent Application No. 10 2020 212 097.8 dated Dec. 31, 2023 (5 pages).

(Continued)

*Primary Examiner* — Mohammad M Choudhry
(74) *Attorney, Agent, or Firm* — Greer, Burns & Crain, Ltd.

(57) ABSTRACT

A wafer processing apparatus including a supporting unit having a frame fixing section fixing the frame, and a wafer table having a front side and a rear side, the front side including a supporting face supporting the wafer and a transparent plate, a liquid layer forming unit including a nozzle section and forming a layer of a liquid on the supporting face of the wafer table, an imaging unit including an imaging camera positioned adjacent to the rear side of the wafer table and opposite to the supporting face on the front side of the wafer table and an air blowing nozzle blowing air to a region between the wafer table and the adhesive sheet.

6 Claims, 6 Drawing Sheets

(56) References Cited

FOREIGN PATENT DOCUMENTS

| JP | 2010087141 A | 4/2010 |
| JP | 2012160659 A | 8/2012 |
| JP | 2014229772 A | 12/2014 |
| JP | 2016064453 A | 4/2016 |
| JP | 2018006520 A | 1/2018 |
| JP | 2019076932 A | 5/2019 |

OTHER PUBLICATIONS

Japanese translated Decision to Grant for corresponding JP Patent Application No. JP 2019-175694 dated Apr. 26, 2023 (2 pages).

\* cited by examiner

WAFER PROCESSING METHOD AND WAFER PROCESSING APPARATUS

CROSS-REFERENCE TO RELATED APPLICATIONS

This application is a divisional of and claims priority to U.S. patent application Ser. No. 17/024,926 filed on Sep. 18, 2020, the entire contents of which is incorporated herein by reference.

BACKGROUND OF THE INVENTION

Field of the Invention

The present invention relates to a wafer processing method for dividing a wafer along a plurality of crossing division lines to obtain a plurality of individual device chips, the division lines being formed on a front side of the wafer to thereby define a plurality of separate regions where a plurality of devices are individually formed. The present invention also relates to a wafer processing apparatus which processes the wafer.

Description of the Related Art

A plurality of crossing division lines are first set on a front side of a wafer, thereby defining a plurality of separate regions on the front side of the wafer. In each separate region, a device such as an integrated circuit (IC) and a large-scale integrated circuit (LSI) is then formed. The wafer having the devices formed thereon is divided into individual device chips by use of a dicing apparatus, a laser processing apparatus, or the like, and the device chips thus obtained are used in electronic equipment such as mobile phones and personal computers.

Also, the plurality of devices may include an image sensor such as a complementary metal oxide semiconductor (CMOS) and a charge coupled device (CCD). When a wafer having the plurality of devices including the above-described image sensor formed on a front side thereof is divided into individual device chips, a processing dust may be adhered to a front side of each device chip, thereby degrading the quality of the device chip. To prevent this, a technique is proposed in which a dicing tape is disposed on the front side of the wafer, the division lines are detected from a back side of the wafer by use of an infrared camera, and the wafer is divided into individual device chips (see, for example, Japanese Patent Laid-Open No. Hei 06-232255).

SUMMARY OF THE INVENTION

A metal film may be formed on a back side of a wafer having the devices described above formed on a frond side thereof, in some cases. In this case, even when the wafer is imaged from the back side thereof by use of an infrared camera, an infrared ray does not pass through the metal film, causing a problem that the division lines formed on the front side of the wafer cannot be detected.

It is therefore an object of the present invention to provide a wafer processing method which can carry out processing for dividing a wafer from a back side of the wafer along division lines even when the back side of the wafer is covered with a metal film, and a wafer processing apparatus which implements such method.

In accordance with an aspect of the present invention, there is provided a wafer processing method for dividing a wafer along a plurality of crossing division lines to obtain a plurality of individual device chips, the division lines being formed on a front side of the wafer to thereby define a plurality of separate regions where a plurality of devices are individually formed. The wafer processing method includes a uniting step of positioning the wafer in an opening of a frame, the opening for accommodating the wafer, attaching an adhesive sheet to the front side of the wafer and to a back side of the frame to thereby unite the wafer and the frame through the adhesive sheet, a liquid layer forming step of forming a layer of a liquid on a supporting face of a wafer table included in a supporting unit, the supporting unit including a frame fixing section fixing the frame, and the wafer table having the supporting face supporting the wafer and formed of a transparent plate, a fixing step of placing a side of the adhesive sheet of the wafer on the wafer table on which the layer of the liquid has been formed, fixing the wafer to the wafer table through the adhesive sheet, and fixing the frame with the frame fixing section, a detecting step of imaging the wafer through the wafer table, the layer of the liquid, and the adhesive sheet with an imaging unit which is positioned opposite to the supporting face of the wafer table to thereby detect the division lines formed on the front side of the wafer, and a processing step of processing a portion on a back side of the wafer, the portion corresponding to each of the division lines which have been detected in the detecting step.

In the aspect of the present invention described above, preferably, the liquid used in the liquid layer forming step is water. Moreover, in the processing step, cutting may be carried out on the portion on the back side of the wafer, the portion corresponding to each of the division lines, with a cutting unit rotatably provided with a cutting blade. In addition, the wafer processing method may further include an unloading step of, after the processing step, blowing air to a region between the wafer table and the adhesive sheet to thereby separate the wafer united with the frame from the supporting unit and unload the wafer.

According to another aspect of the present invention, there is provided a wafer processing apparatus which divides a wafer along a plurality of crossing division lines to obtain a plurality of individual device chips, the division lines being formed on a front side of the wafer to thereby define a plurality of separate regions where a plurality of devices are individually formed, the wafer being positioned in an opening of a frame, the opening for accommodating the wafer, an adhesive sheet being attached to the front side of the wafer and to a back side of the frame, thereby uniting the wafer with the frame through the adhesive sheet. The wafer processing apparatus includes a supporting unit having a frame fixing section fixing the frame, and a wafer table having a supporting face supporting the wafer and formed of a transparent plate, a liquid layer forming unit including a nozzle section and forming a layer of a liquid on the supporting face of the wafer table, an imaging unit including an imaging camera capable of being positioned opposite to the supporting face of the wafer table, and an air blowing nozzle blowing air to a region between the wafer table and the adhesive sheet.

According to the wafer processing method of the present invention, even when the back side of the wafer is covered with the metal film, the wafer is accurately processed along the division lines from the back side of the wafer, and the wafer can be divided into individual device chips. Moreover, even in a case in which a back side of the adhesive sheet is subjected to frosting, the layer of the liquid allows the field of view to become clear, and accordingly, it is possible to positively detect the division lines formed on the front side of the wafer seen through the adhesive sheet.

Moreover, according to the wafer processing apparatus of the present invention, even when the back side of the wafer is covered with the metal film, the wafer is accurately processed along the division lines from the back side of the wafer, and the wafer can be divided into individual device chips. Moreover, even in a case in which a back side of the adhesive sheet is subjected to frosting, the layer of the liquid allows the field of view to become clear, and accordingly, it is possible to positively detect the division lines formed on the front side of the wafer seen through the adhesive sheet.

The above and other objects, features, and advantages of the present invention and the manner of realizing them will become more apparent, and the invention itself will best be understood from a study of the following description and appended claims with reference to the attached drawings depicting a preferred embodiment of the invention.

DETAILED DESCRIPTION OF THE PREFERRED EMBODIMENT

A wafer processing method and a wafer processing apparatus according to a preferred embodiment of the present invention will now be described in detail with reference to the attached drawings.

Figure 1:
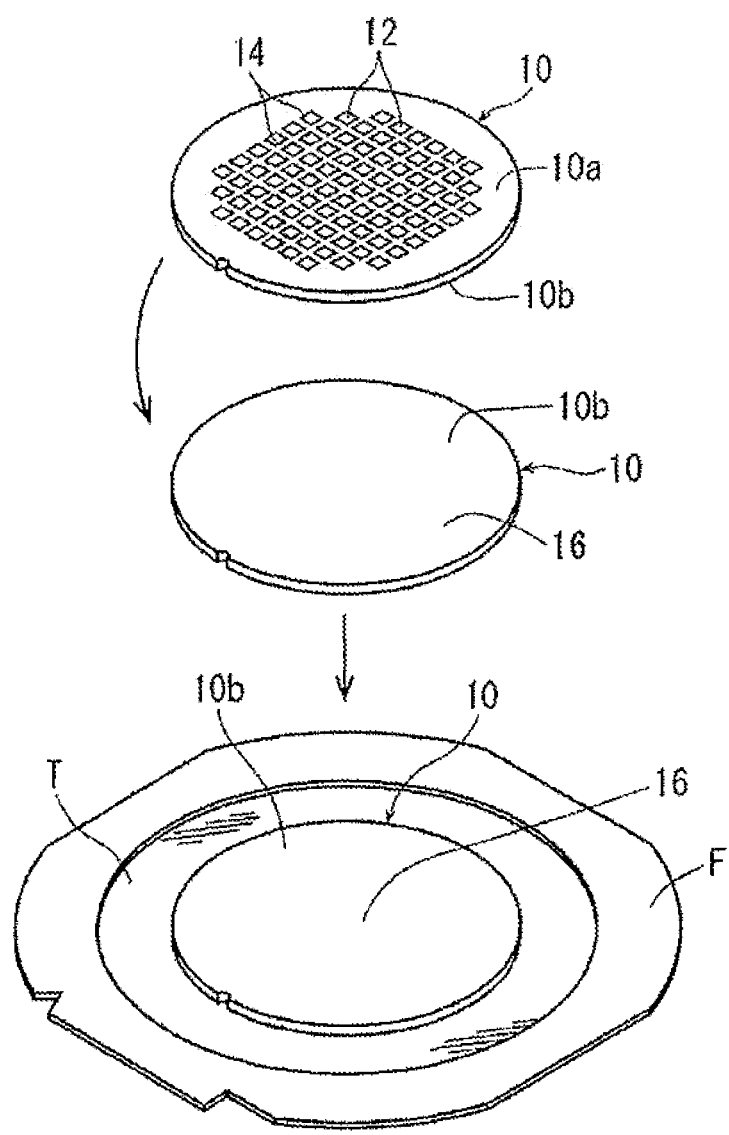
FIG. 1 is a schematic perspective view of a wafer as a workpiece to be processed in a wafer processing method according to a preferred embodiment of the present invention.

In FIG. 1, an example of a workpiece to be processed in the wafer processing method and the wafer processing apparatus according to the preferred embodiment of the present invention is illustrated. The workpiece depicted in FIG. 1 is a wafer 10 having a front side 10a and a back side 10b. A plurality of crossing division lines 14 are formed on the front side 10a of the wafer 10 to thereby define a plurality of respective separate regions where a plurality of devices 12 are formed. a metal film 16 is formed on the back side 10b of the wafer 10. As depicted in FIG. 1, an annular frame F having an opening capable of accommodating the wafer 10 is provided, and the wafer 10 is reversed such that the back side 10b with the metal film 16 formed thereon is oriented upward and positioned in the opening of the frame F. Then, in this condition, an adhesive sheet T is attached to a back side of the frame F and the front side 10a of the wafer 10 to thereby support the wafer 10 through the adhesive sheet T. Accordingly, the wafer 10 is united to the frame F through the adhesive sheet T.

Figure 2:
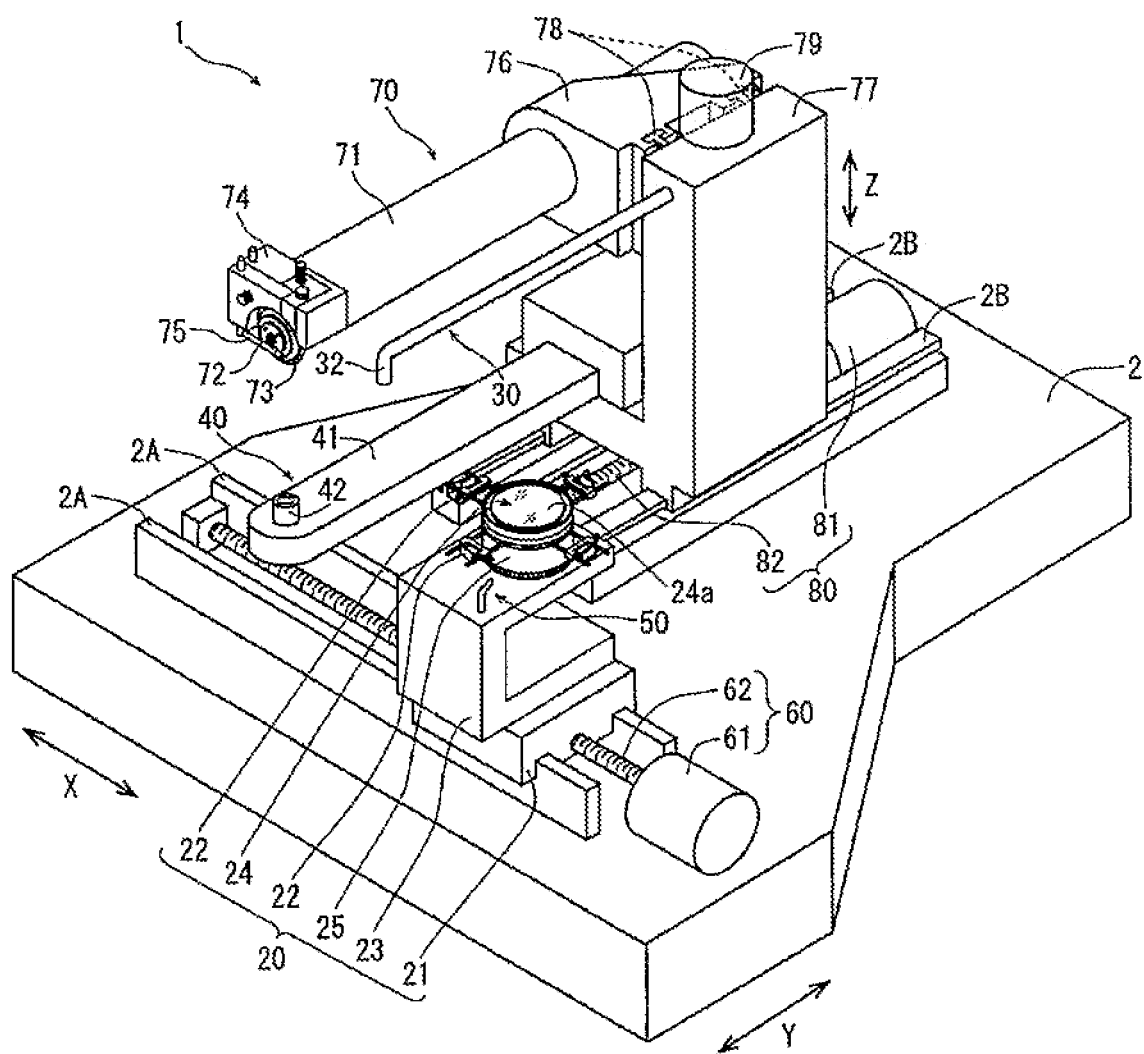
FIG. 2 is a schematic perspective view depicting a wafer processing apparatus according to the preferred embodiment.

FIG. 2 illustrates a perspective view of an entire dicing apparatus 1 as an example of a wafer processing apparatus suitable for implementing the wafer processing method of the present invention. The dicing apparatus 1 includes a supporting unit 20, a liquid layer forming unit 30, an imaging unit 40, and an air blowing unit 50. Specifically, the supporting unit 20 includes at least a plurality of clamps 22 functioning as a frame fixing section, and a wafer table 24 having a supporting face 24a supporting the wafer 10 and formed of a transparent plate. The liquid layer forming unit 30 forms a liquid layer on the wafer table 24 included in the supporting unit 20. The imaging unit 40 is disposed so as to be able to be positioned opposite to the supporting face 24a of the wafer table 24. The air blowing unit 50 blows air to a region between the wafer table 24 and the adhesive sheet T.

Further, the dicing apparatus 1 includes an X-axis moving mechanism 60, a cutting unit 70, and a Y-axis moving mechanism 80. Specifically, the X-axis moving mechanism 60 feeds the supporting unit 20 in an X-axis direction indicated with an arrow X in FIG. 2. The cutting unit 70 cuts the wafer 10 held on the wafer table 24 as a processing unit which processes the back side 10b of the wafer 10. The Y-axis moving mechanism 80 indexes the cutting unit 70 in a Y-axis direction indicated with an arrow Y in FIG. 2, the Y-axis direction perpendicular to the X-axis direction.

As depicted in FIG. 2, the supporting unit 20 includes a rectangular-shaped X-axis direction movable plate 21, a support table 23 in a substantially U-shape (C shape) in cross section, and a rotatable support column 25 in a cylindrical shape. Specifically, the X-axis direction movable plate 21 is mounted on a base table 2 to be movable in the X-axis direction. The support table 23 is fixed on an upper surface of the X-axis direction movable plate 21. The rotatable support column 25 is disposed on the support table 23 and has the wafer table 24 placed thereon. The plurality of clamps 22 described above are disposed between the rotatable support column 25 and the wafer table 24 at equal intervals in a circumferential direction.

The X-axis moving mechanism 60 converts rotational motion of a motor 61 to linear motion through a ball screw 62 and transmits the linear motion to the X-axis direction movable plate 21 to thereby move the X-axis direction movable plate 21 back and forth in the X-axis direction along a pair of X-axis guide rails 2A disposed on the base table 2.

The cutting unit 70 is disposed adjacent in the Y-axis direction to a region in which the supporting unit 20 moves in the X-axis direction, that is, at a backward position in the Y-axis direction. The cutting unit 70 includes a spindle unit 71. The spindle unit 71 includes a cutting blade 73 having a cutting edge at an outer circumference thereof and fixed to a tip end of a rotary spindle 72, and a blade cover 74 protecting the cutting blade 73. The blade cover 74 has cutting water supplying means 75 disposed at a position adjacent to the cutting blade 73, and the cutting water supplying means 75 supplies cutting water which is introduced through the blade cover 74 toward a cutting position. On another tip end side of the spindle unit 71, a rotational driving source such as a motor, not depicted, is accommodated, and the motor rotates the rotary spindle 72 about its axis, thereby rotating the cutting blade 73.

The cutting unit 70 described above is supported by a cutting unit supporting section 77. A pair of Y-axis guide rails 2B in parallel to the Y-axis direction is disposed on the base table 2, and the cutting unit supporting section 77 is slidably attached to the pair of Y-axis guide rails 2B. The cutting unit supporting section 77 is configured so as to be movable along the Y-axis direction by the Y-axis moving mechanism 80. The Y-axis moving mechanism 80 converts rotational motion of a motor 81 to linear motion through a ball screw 82 and transmits the linear motion to the cutting unit supporting section 77, thereby moving the cutting unit supporting section 77 back and forth in the Y-axis direction along the pair of the Y-axis guide rails 2B on the base table 2.

A pair of Z-axis guide rails 78 in parallel to a Z-axis direction indicated with an arrow Z (up and down direction) is provided on an upper side surface of the cutting unit supporting section 77. A Z-axis moving table 76 supporting the spindle unit 71 is slidably attached to the pair of Z-axis guide rails 78. A motor 79 is disposed in the cutting unit supporting section 77, and rotation of the motor 79 is converted to linear motion through a ball screw not depicted, so that the linear motion is transmitted to the Z-axis moving table 76. Rotating the motor 79 causes the spindle unit 71 to move up and down in the Z-axis direction through the Z-axis moving table 76.

The imaging unit 40 includes a camera extension member 41 provided to the cutting unit supporting section 77, and an imaging camera 42 disposed at a tip end portion of the camera extension member 41. When the support table 23 is moved in the X-axis direction to be positioned directly below the cutting blade 74, the imaging camera 42 is positioned inside the space defined by the U-shaped surfaces of the support table 23. Then, the imaging camera 42 is positioned opposite to the supporting face 24a of the wafer table 24. As a result, it is possible to image the front side 10a of the wafer 10 supported on the wafer table 24 from a lower side with the imaging camera 42. When cutting of the wafer 10 is carried out, the imaging unit 40 images the wafer 10 and obtains an image of the wafer 10 to carry out alignment, so that a position of each division line 14 of the wafer 10 to be cut is detected.

The liquid layer forming unit 30 is provided in the cutting unit supporting section 77 and formed at a position in the X-axis direction adjacent to the spindle unit 71 constituting the cutting unit 70. A nozzle section 32 is formed at a tip end of the liquid layer forming unit 30 in such a manner as to be positioned directly above a center of the wafer table 24 when the wafer table 24 is moved in the X-axis direction. The liquid layer forming unit 30 includes liquid supplying means not depicted, and a liquid which is pressure-fed from the liquid supplying means is supplied by a predetermined amount from the nozzle section 32 downward. The liquid supplied from the liquid layer forming unit 30 is a transparent liquid, preferably water.

Figure 3:
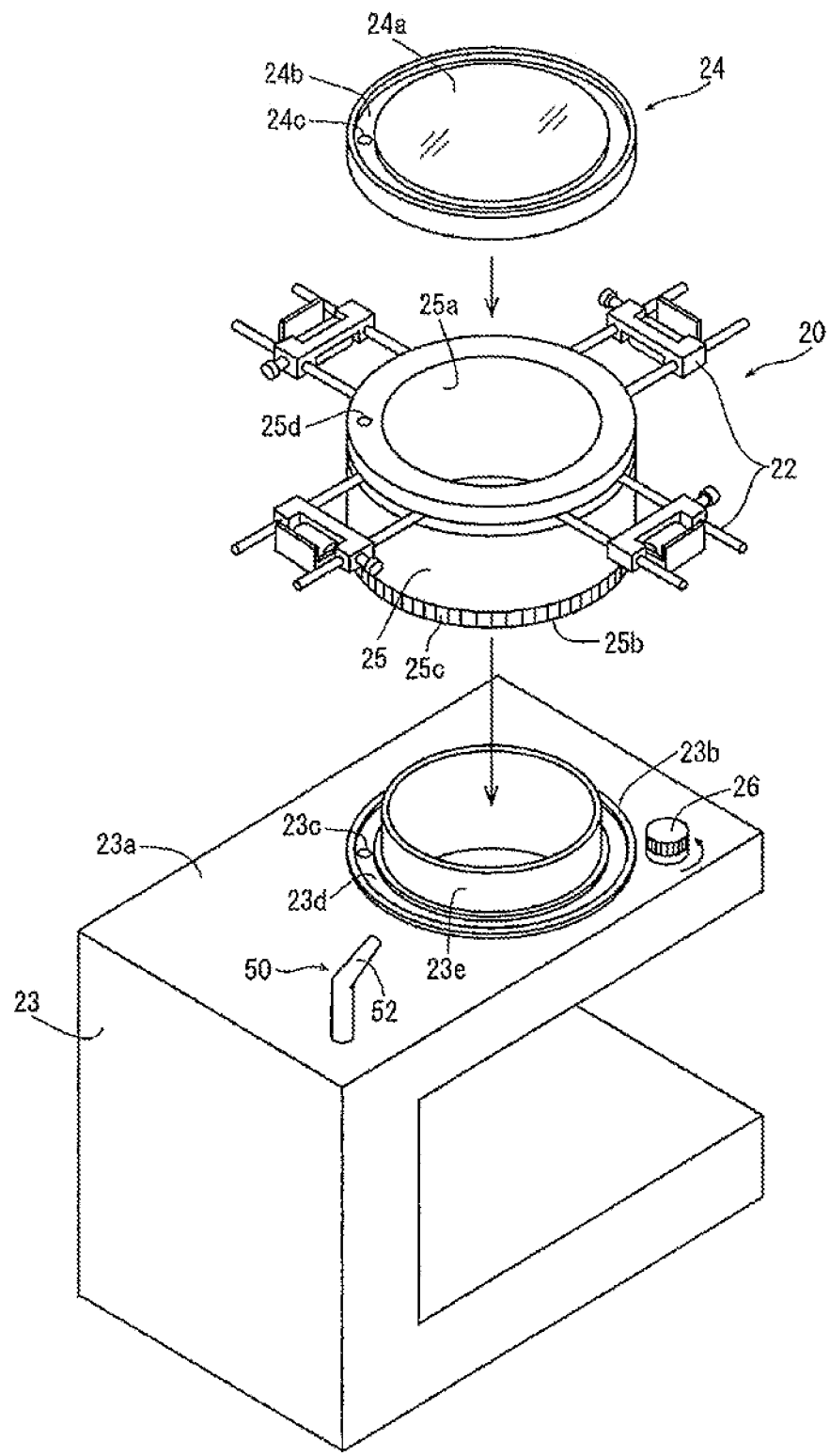
FIG. 3 is a schematic exploded perspective view depicting part of a supporting unit disposed in the wafer processing apparatus depicted in FIG. 2.

With reference to FIG. 3, the supporting unit 20 depicted in FIG. 2 will be described in more detail. FIG. 3 is a view depicting a state in which members which are included in the supporting unit 20 and are formed on the support table 23 are exploded. A ring-shaped sliding member 23b is disposed on an upper surface 23a of the support table 23 formed in the substantially U-shape in cross section, and the sliding member 23b has a suction groove 23d provided with a suction hole 23c at its bottom, the suction hole 23c being connected to a suction pump not depicted. A cylindrical member 23e is erected on a central side of the sliding member 23b. The rotatable support column 25 is a cylindrical member, and while the cylindrical member 23e of the support table 23 is inserted into a hollow section 25a of the rotatable support column 25, a support column bottom portion 25b of the rotatable support column 25 is placed on the the sliding member 23b. A driven gear 25c is formed at a lower side of the rotatable support column 25 around an outer circumference of the rotatable support column 25 and is set in such a way as to mesh with a gear of a rotation transmission section 26 which is disposed on the upper surface 23a of the support table 23 to transmit rotation of a motor not depicted. An inner diameter of the hollow section 25a of the rotatable support column 25 is formed slightly larger than an outer diameter of the cylindrical member 23e, and the support column bottom portion 25b of the rotatable support column 25 has a small projecting portion formed therein such that the projecting portion corresponds to a shape of the suction groove 23d of the sliding member 23d. Accordingly, rotation of the rotation transmission section 26 is transmitted to the rotatable support column 25, causing the rotatable support column 25 to rotate in a smoothed manner. A communication hole 25d penetrating in the up and down direction is formed in the rotatable support column 25. A negative pressure from the suction hole 23c is applied to a space formed by the suction groove 23d and the bottom portion of the rotatable support column 25. The negative pressure from the suction hole 23c is also applied to an upper surface of the rotatable support column 25 through the communication hole 25d.

The wafer table 24 is placed on the upper surface of the rotatable support column 25. At least the supporting face 24a of the wafer table 24 which supports a wafer is formed of a transparent plate. The transparent plate is formed of glass, but the transparent plate of the present invention is not limited to this. Alternatively, the transparent plate of the present invention may be formed of a transparent plate made of acrylic resin. A ring shaped suction groove 24b is formed around an outer circumference of the supporting face 24a of the wafer table 24. A suction hole 24c communicating with the communication hole 25d of the rotatable support column 25 is formed at a bottom portion of the suction groove 24b. An inner diameter of the suction groove 24b is set slightly larger than an outer diameter of the wafer 10. Accordingly, when the wafer 10 is fixed on the wafer table 24, the adhesive sheet T is sucked along the outer circumference of the wafer 10, so that the wafer 10 is fixed.

An air blowing nozzle 52 of the air blowing unit 50 is disposed on the upper surface 23a of the support table 23. The air blowing nozzle 52 is disposed close to the rotatable support column 25, and an air pump not depicted is operated to cause the air blowing nozzle 52 to eject air from a lateral side of the rotatable support column 25 toward the supporting face 24a of the wafer table 24.

The dicing apparatus 1 according to the preferred embodiment of the present invention substantially includes the above-described configuration, and a wafer processing method implemented by the dicing apparatus 1 according to this embodiment will be described below.

At the time of carrying out the wafer processing method according to this embodiment, first, as depicted in FIG. 1, a uniting step is carried out in which the wafer 10 is positioned in the opening of the frame F, the opening for accommodating the wafer 10, and the adhesive sheet T is attached to the front side 10a of the wafer 10 and a back side of the frame F to unit the wafer 10 and the frame F through the adhesive sheet T (uniting step). As a result, the wafer 10 is held on the frame F through the adhesive sheet T in a condition in which the back side 10b with the metal film 16 formed thereon is oriented upward, the back side 10b being opposite to the front side 10a where the division lines 14 are formed.

Figure 4:
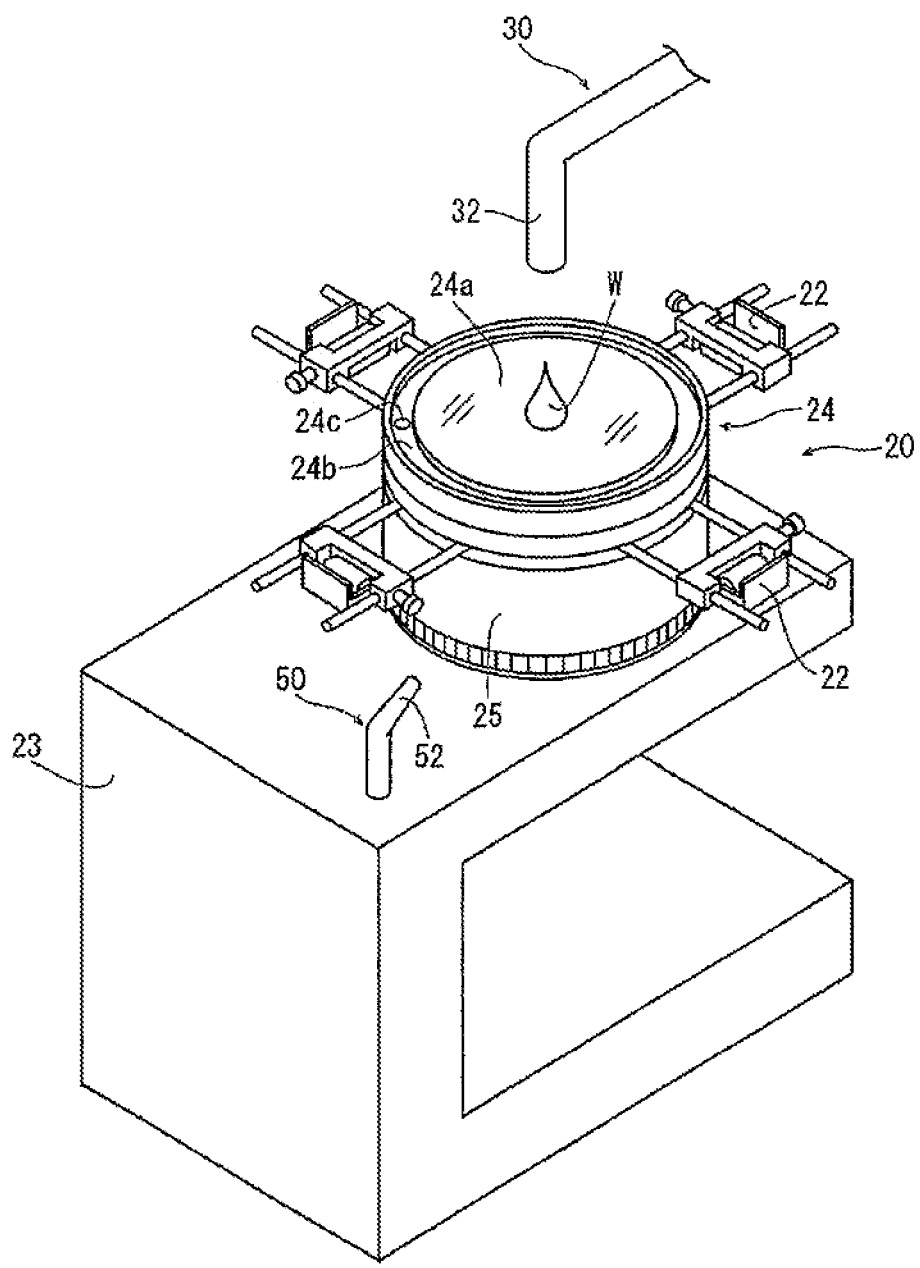
FIG. 4 is a schematic perspective view depicting a manner of carrying out a liquid layer forming step.

After the uniting step has been carried out, the X-axis moving mechanism 60 is operated to move the support table 23 in the X-axis direction, and the center of the wafer table 24 is positioned directly below the nozzle section 32 of the liquid layer forming unit 30. At this time, as necessary, the Y-axis moving mechanism 80 may be operated to adjust a position of the cutting unit supporting section 77 which supports the liquid layer forming unit 30. After the center of the wafer table 24 has been moved directly below the nozzle section 32, as depicted in FIG. 4, transparent liquid W (water in this embodiment) is supplied by a predetermined amount from a distal end of the nozzle section 32, and a liquid layer is formed on the wafer table 24 (liquid layer forming step). The predetermined amount of the transparent liquid W to be supplied is an amount capable of fixing the wafer 10 through the adhesive sheet T onto the wafer table 24 due to surface tension when the adhesive sheet T to which the wafer 10 is attached is placed on the wafer table 24 as described later.

As described above, after the layer of the liquid W has been formed on the wafer table 24, the adhesive sheet T side of the wafer 10 with the adhesive sheet T attached to the front side 10a thereof is placed on the wafer table 24, and then, the wafer 10 is fixed to the wafer table 24 through the adhesive sheet T due to the surface tension of the liquid W, while at the same time, suction means not depicted is operated to apply a negative pressure to the suction groove 24b of the wafer table 24 through the suction hole 24c, thereby sucking the adhesive sheet T along the outer circumference of the wafer 10. In addition, the frame F is fixed with the plurality of clamps constituting the frame fixing section in this embodiment (fixing step).

Figure 5:
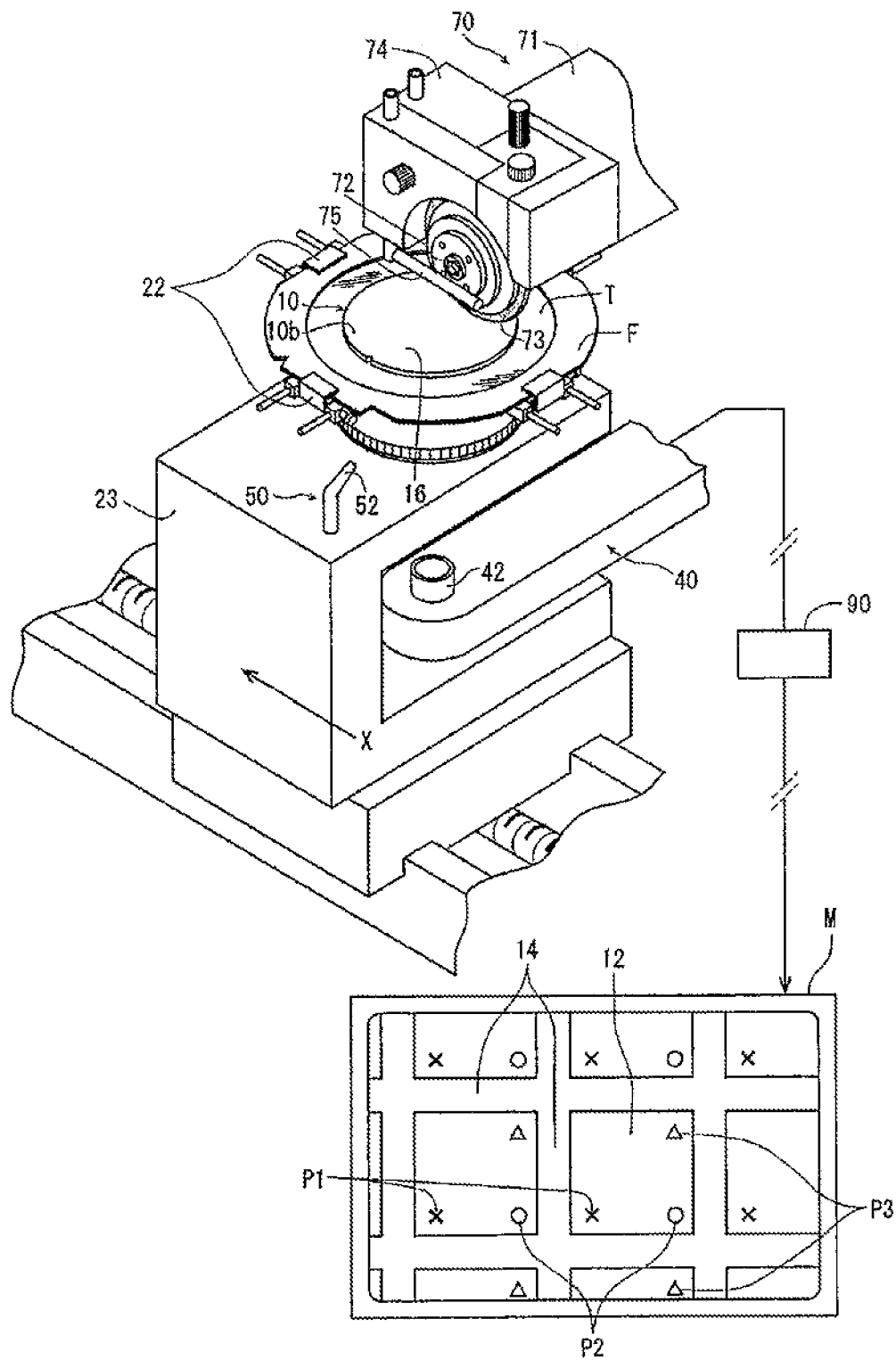
FIG. 5 is a schematic perspective view depicting a manner of carrying out a detecting step.

As described above, after the wafer 10 has been fixed to the wafer table 24, as depicted in FIG. 5, the X-axis moving mechanism 60 is operated to move the support table 23 in the X-axis direction, and the center of the wafer table 24 is moved directly above the imaging camera 42 of the imaging unit 40. As described above, the wafer table 24 is formed of the transparent plate, and the layer of the liquid W is formed between the wafer table 24 and the adhesive sheet T. Accordingly, the filed of view becomes clear even if the back side of the adhesive sheet T supporting the wafer 10 is in such a state to be subjected to frosting. In this condition described above, the front side 10a of the wafer 10 is imaged through the wafer table 24 from the lower side with the imaging camera 42, and as depicted in FIG. 5, the obtained image of the wafer 10 is transmitted to a control unit 90 disposed in the dicing apparatus 1 so as to be displayed on a display monitor M, as necessary.

The control unit 90 includes a computer configured with a central processing unit (CPU) computing in accordance with a control program, a read-only memory (ROM) storing the control program or the like, a readable/writable random-access memory (RAM) for temporarily storing the image captured by the imaging unit 40, other computed result, or the like, an input interface, and an output interface, although a detailed illustration thereof is omitted. The control unit 90 includes the control program which controls each component of the dicing apparatus 1, records appropriate information including an image captured by the imaging unit 40, and detects a position of each of the division lines 14 by carrying out pattern matching or the like on the basis of the obtained image captured by the imaging unit 40.

It is possible to clearly image the front side 10a of the wafer 10 through the wafer table 24, the adhesive sheet T, and the layer of the liquid W with the imaging unit 40 described above. The control unit 90 carries out image processing such as the pattern matching on the image in which feature marks P1, P2, and P3 formed on the front side 10a of the wafer 10 are captured, thereby performing alignment to detect each of the division lines 14, and stores positional information of each of the division lines 14 (detecting step). Specifically, the imaging unit 40 makes it possible to detect each of the division lines 14 formed on the front side 10a of the wafer 10 by passing through the wafer table 24 and the adhesive sheet T.

Figure 6:
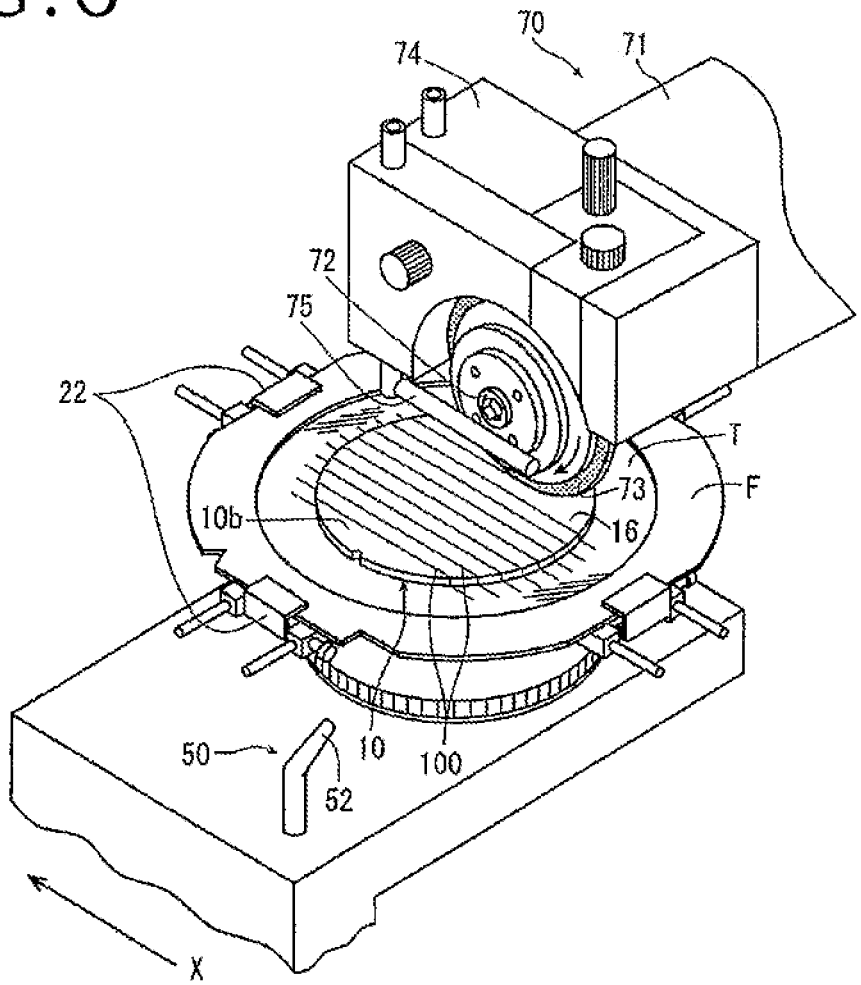
FIG. 6 is a schematic perspective view depicting a manner of a processing step.

After the division lines 14 have been detected, the control unit 90 positions the wafer 10 which is fixed to the wafer table 24 directly below the cutting unit 70, and then operates the cutting unit 70 to rotate the cutting blade 73 about its own axis according to the positional information of each of the division lines 14 which has been detected in the detecting step described above, thereby to form a division groove 100 along a predetermined one of the division lines 14 extending in a first direction in parallel with the X-axis direction from the back side 10b of the wafer 10, as depicted in FIG. 6. After the division groove 100 has been formed along a predetermined one of the division line 14 extending in the first direction, the Y-axis moving mechanism 80 is operated to index the wafer 10 by a pitch of the division lines 14 in the Y-axis direction to form a plurality of division grooves 100 along all of the other division lines 14 formed in the first direction. Then, the rotation transmission section 26 described above is operated to rotate the wafer table 24 at 90 degrees along with the rotatable support column 25, and a plurality of division grooves 100 are similarly formed along all of the division lines 14 extending in a second direction perpendicular to the first direction in which the division grooves 100 has been formed previously. In this manner, the division grooves 100 are formed from the back side 10b of the wafer 10 along all of the division lines 14 formed on the front side 10a of the wafer 10 (processing step).

Figure 7:
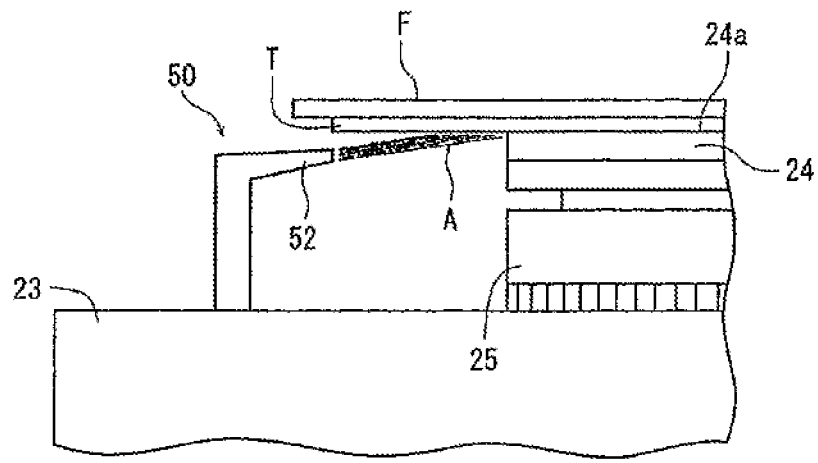
FIG. 7 is a schematic perspective view depicting a manner of operating an air blowing unit in an unloading step.

As described above, after the processing step has been carried out, preferably, the clamps 22 of the supporting unit 20 is released, and the air blowing unit 50 is operated to blow air A from the lateral side toward a region between the wafer table 24 and the adhesive sheet T from the air blowing nozzle 52, as depicted in FIG. 7. Accordingly, the air A removes the surface tension which has been formed between the wafer table 24 and the adhesive sheet T due to the liquid W, thereby separating the adhesive sheet T and the wafer table 24 from each other. After the adhesive sheet T and the wafer table 24 have been separated from each other, the wafer 10 is unloaded from the supporting unit 20 to an apparatus or the like to be used in a later step or a cassette for accommodating the wafer 10 (unloading step), although such apparatus or cassette is not depicted.

In the foregoing embodiment, as the wafer processing method and the wafer processing apparatus which process a wafer, an example of the wafer processing method and the wafer processing apparatus has been given in which the division grooves 100 are formed by cutting the wafer 10 with use of the cutting blade 73 to thereby divide the wafer 10 into individual device chips. However, the wafer processing method and the wafer processing apparatus according to the present invention are not limited to this and may be a wafer processing method in which a laser processing unit including a laser oscillator as a processing unit is used and a wafer processing apparatus provided with such laser processing unit.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing apparatus which divides a wafer along a plurality of crossing division lines to obtain a plurality of individual device chips, the division lines being formed on a front side of the wafer to thereby define a plurality of separate regions where a plurality of devices are individually formed, the wafer being positioned in an opening of a frame, the opening for accommodating the wafer, an adhesive sheet being attached to the front side of the wafer and to a back side of the frame, thereby uniting the wafer with the frame through the adhesive sheet, the wafer processing apparatus comprising:
- a supporting unit including a wafer table having a transparent plate and a front side and a rear side, the front side of the wafer table including a supporting face configured for supporting the wafer;
- a liquid layer forming unit including a nozzle section and forming a layer of a liquid on the supporting face of the wafer table, wherein the adhesive sheet attached to the front side of the wafer is placed on the layer of the liquid;
- an imaging unit including an imaging camera positioned adjacent to the rear side of the wafer table and opposite to the supporting face on the front side of the wafer table; and
- an air blowing nozzle blowing air to a region between the wafer table and the adhesive sheet.

2. The wafer processing apparatus according to claim 1, further providing a supporting section including the imaging unit and a processing device, wherein said supporting section is movable so that the imaging unit and the processing device are positioned on opposing sides of the wafer table.

3. The wafer processing apparatus according to claim 1, wherein the frame fixing section includes a supporting unit having a ring-shaped sliding member disposed on a surface of a support table and a cylindrical member attached to the sliding member.

4. The wafer processing apparatus according to claim 1, wherein the air blowing nozzle is disposed on the supporting face of the wafer table.

5. The wafer processing apparatus according to claim 1, further comprising a ring-shaped suction groove formed around an outer circumference of the supporting face of the wafer table, wherein the suction groove a portion of the adhesive sheet around the circumference of the wafer.

6. The wafer processing apparatus according to claim 2, wherein the supporting section includes the liquid layer forming unit.

* * * * *